United States Patent [19]
Kohno et al.

[11] Patent Number: 5,322,806
[45] Date of Patent: Jun. 21, 1994

[54] METHOD OF PRODUCING A SEMICONDUCTOR DEVICE USING ELECTRON CYCLOTRON RESONANCE PLASMA CVD AND SUBSTRATE BIASING

[75] Inventors: Yasutaka Kohno; Masayuki Sakai, both of Itami, Japan

[73] Assignee: Mitsubishi Denki Kabushiki Kaisha, Tokyo, Japan

[21] Appl. No.: 393,950

[22] Filed: Aug. 15, 1989

[30] Foreign Application Priority Data

Aug. 24, 1988 [JP] Japan .................. 63-209994
Dec. 22, 1988 [JP] Japan .................. 63-325455

[51] Int. Cl.$^5$ ............... H01L 21/00; H01L 21/02; H01L 21/265; H01L 21/44
[52] U.S. Cl. ................. 437/40; 437/192; 437/200
[58] Field of Search .............. 437/40, 192, 200; 427/38, 39; 118/723, 724, 50.1

[56] References Cited

U.S. PATENT DOCUMENTS

| | | | |
|---|---|---|---|
| 4,356,623 | 11/1982 | Hunter | 437/192 |
| 4,401,054 | 8/1983 | Matsuo et al. | 118/724 |
| 4,585,668 | 4/1986 | Asmussen et al. | 437/238 |
| 4,683,838 | 8/1987 | Kimura et al. | 118/723 |
| 4,732,761 | 3/1988 | Machida et al. | 437/245 |

FOREIGN PATENT DOCUMENTS

| | | |
|---|---|---|
| 0209109 | 1/1987 | European Pat. Off. . |
| 0283311 | 9/1988 | European Pat. Off. . |
| 0162349 | 10/1982 | Japan .................. 437/235 |
| 61-154046 | 7/1986 | Japan . |
| 63132451 | 11/1986 | Japan . |
| 62-92481 | 4/1987 | Japan . |
| 63258007 | 4/1990 | Japan . |
| 2173822 | 10/1986 | United Kingdom . |

*Primary Examiner*—William A. Powell
*Assistant Examiner*—B. Everhart
*Attorney, Agent, or Firm*—Leydig, Voit & Mayer

[57] ABSTRACT

A method of producing a semiconductor device including the steps of depositing a refractory metal gate electrode at a predetermined region of a semi-insulating substrate surface, and thereafter depositing an insulating film at regions other than the gate electrode region, wherein the production of the insulating film is carried out by an electron cyclotron resonance plasma CVD method while applying a high frequency electrical bias to the substrate.

6 Claims, 11 Drawing Sheets

METHOD OF PRODUCING A SEMICONDUCTOR DEVICE USING ELECTRON CYCLOTRON RESONANCE PLASMA CVD AND SUBSTRATE BIASING

FIELD OF THE INVENTION

The present invention relates to a method of producing a semiconductor device, and more particularly, to a technique of lowering gate resistance in a method of producing a refractory metal self-aligning gate GaAs field effect transistor.

BACKGROUND OF THE INVENTION

Figures 7A, 7B:
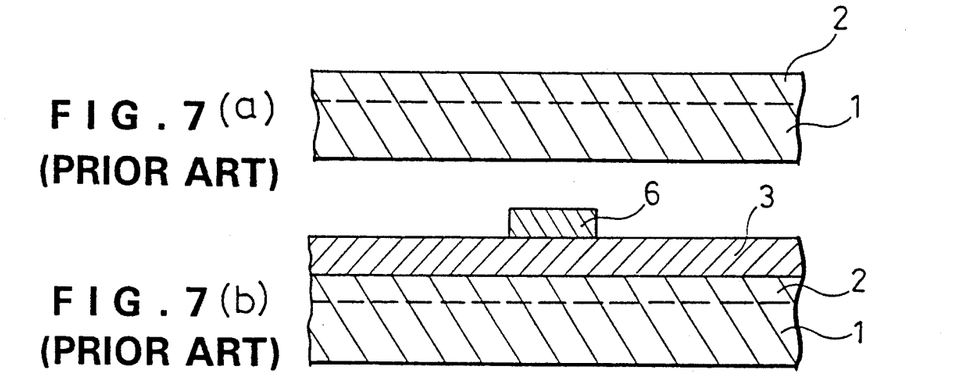
FIGS. 7(a) to 7(i) are cross-sectional views in the major production process steps of a method of producing a semiconductor device according to the prior art.

FIGS. 7(a) to 7(a) show cross-sectional views of the major production process steps of a method of producing a semiconductor device according to the prior art.

First of all, as shown in FIG. 7(a), an active layer 2 is produced at a desired position on a semi insulating GaAs substrate 1 by ion implantation. Thereafter, as shown in FIG. 7(b), a refractory metal silicide layer, such as WSix layer 3 is plated on the entire surface of semi-insulating GaAs substrate 1 by sputtering or deposition another deposition process and a gate pattern comprising photoresist film 6 is formed on a portion where a gate is to be produced.

Figure 7C:
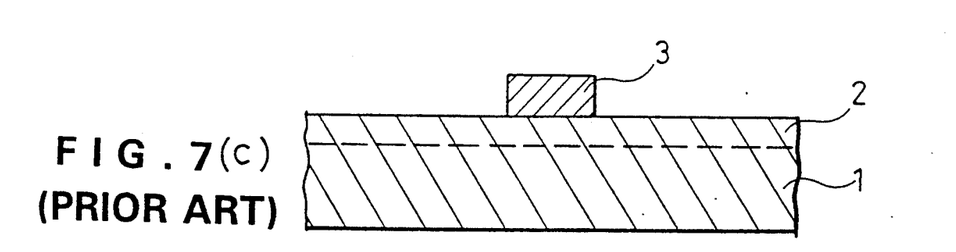

Next, as shown in FIG. 7(c), the WSix layer 3 is selectively etched by reactive ion etching (hereinafter referred to as RIE) using $CF_4+O_2$ or $SF_6$ gas using the photoresist film 6 as a mask. Then, ion implantation using the selectively etched WSix layer 3, that is, a refractory metal gate, as a mask and annealing are carried out to produce a high concentration doping layer 4 (FIG. 7(d)). Thereafter, as shown in figure 7(e), an insulating film (SiO2 film) 5 is deposited on the entire surface of semi-insulating GaAs substrate 1 in a plasma CVD apparatus. As shown in FIG. 7(f), a photoresist film 9 is deposited thereon to flatten the surface.

Figure 7D:
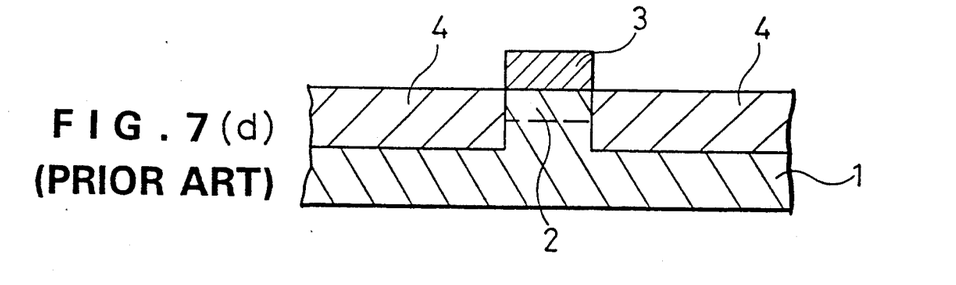
Figure 7E:
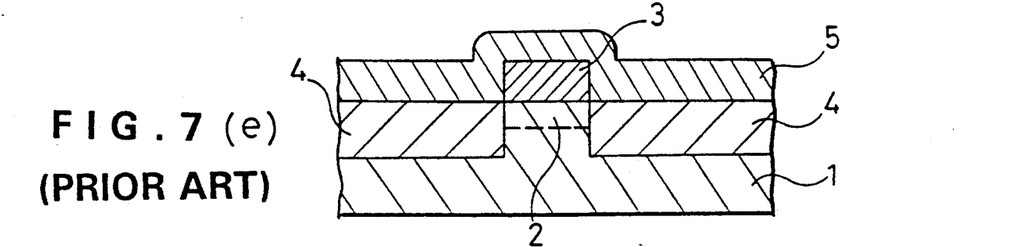
Figure 7F:
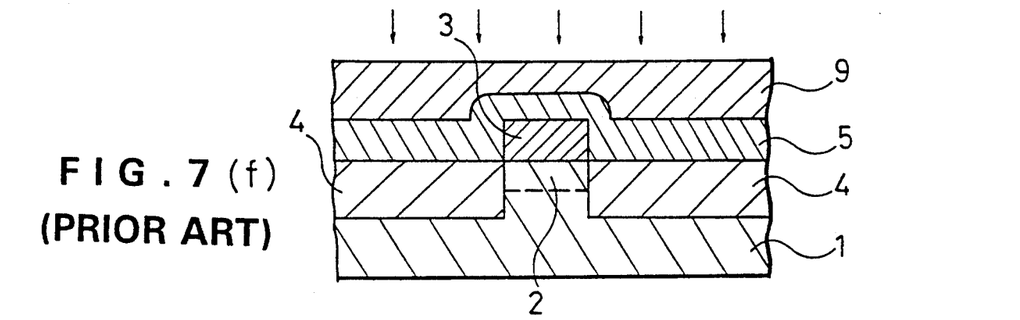
Figure 7G:
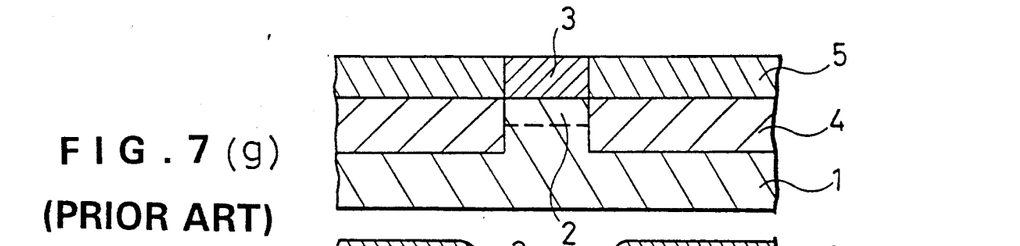
Figure 7H:
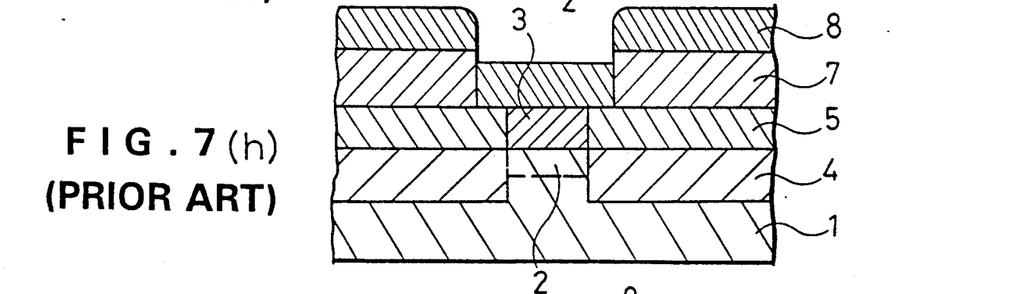
Figure 7I:
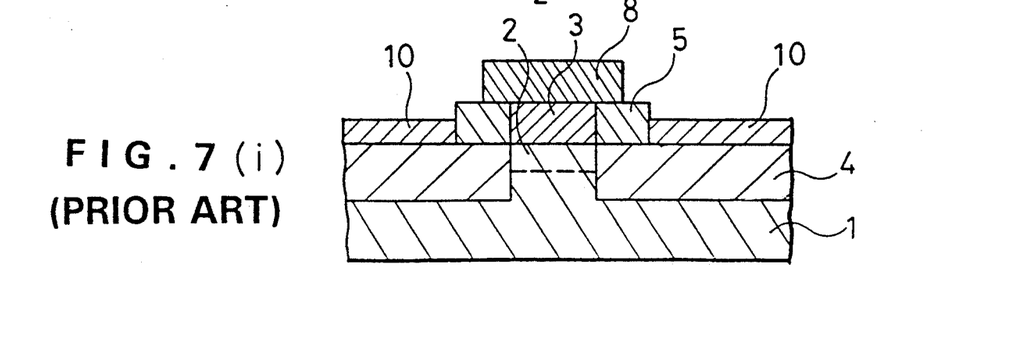

Thereafter, the WSix layer 3 is exposed by etching the photoresist film 9 and the insulating film 5 at equal rates (FIG. 7(g)). Thereafter, as shown in FIG. 7(h), the photoresist film 7 is formed into a pattern, and the multiple layer, low resistance metal film 8 such as Ti/-Mo/Au, is deposited and lifted off. Thereafter, as shown in FIG. 7(i), a source and drain electrode 10 are deposited.

In the production method of a semiconductor device according to the prior art, however, it is necessary to expose the WSix film surface uniformly over the entire surface of wafer in the process of exposing the top portion of the refractory metal gate electrode (WSix film) 3. To achieve that result, a high uniformity in the insulating film thickness and in the planarity of the surface of photoresist film are required, thereby resulting in reduction in the yield.

Furthermore, the growth of the insulating film, depositing of the photoresist film, or etching back of the photoresist film have to be conducted by separate apparatus, thereby resulting in problems in the work efficiency.

SUMMARY OF THE INVENTION

It is an object of the present invention to provide a method of producing a semiconductor device capable of exposing a refractory metal gate layer surface with a high uniformity in the wafer surface, and thereby capable of producing a semiconductor device having a low resistance gate by a simplified production process.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a production method of a semiconductor device of the present invention, a refractory metal gate electrode is selectively produced on a substrate, regions other than the gate electrode region of the substrate surface are covered by insulating films produced by electron cyclotron resonance plasma chemical vapor deposition method with application of a high frequency substrate bias. Further the refractory metal gate electrode comprises a refractory metal silicide layer and a refractory metal layer disposed thereon. Accordingly, the deposition of the insulating film, the flattening of insulating film, and the exposure of top portion of the refractory metal gate electrode can be carried out at the same time, and the exposure of the top portion of the refractory metal gate electrode can be carried out uniformly. Further, the refractory metal layer is thin enough for processing of the double layer vertically in the RIE step, and refractory metal layer is thick enough for sufficient selectivity during sputter etching. Accordingly, the exposure of the refractory metal gate electrode can be carried out repeatedly without risking removal of the electrode.

DETAILED DESCRIPTION OF THE PREFERRED EMBODIMENTS

An embodiment of the present invention will be described in detail with reference to the drawings.

FIGS. 1(a) to (d) are cross-sectional views of the major production process steps of a method of producing a semiconductor device according to a first embodiment of the present invention. In FIG. 1, the same reference numerals as those in FIG. 7 designate the same elements. Reference numeral 5a designates silicon oxide film of 1000 Angstroms thickness produced the electron cyclotron resonance (ECR) plasma CVD method without applying a substrate bias with the flow rates of silane and oxygen being 5:3 and the gas pressure being $1.0 \times 10^{-3}$ Torr. A silicon oxide film 5b having a flat surface is produced by an ECR plasma CVD method while applying a high frequency bias of 80 W to the substrate 1 with the flow rates of argon, silane, and oxygen being 6:1:5 and the gas pressure being $7 \times 10^{-4}$ Torr. A silicon oxide film 5c is obtained in an ECR plasma process including a mixture of $N_2$ and Ar while applying a high frequency bias of 80 W to the substrate 1 and sputtering the silicon oxide film 5b until the WSix film 3 is exposed.

The production process will be described.

The production processes that precede FIG. 1(a) are the same as those of FIGS. 7(a) to (d) of the prior art method. However, the thickness of the WSix film 3 is 3000 Angstroms.

After a refractory metal gate electrode (WSix film) 3 is produced as shown in FIG. 7(d), a silicon oxide film 5a is deposited as shown in FIG. 1(a) to a thickness of 1000 Angstroms with the flow rates of silane and oxygen being 5:3 and the gas pressure being $1.0 \times 10^{-3}$ Torr by an ECR plasma CVD method without applying a substrate bias. In this case, differently from the general plasma CVD method, the silicon oxide film 5a is not deposited over the side wall of the WSix film 3.

Thereafter, a silicon oxide film 5b is deposited while applying a high frequency bias of 80 W to the substrate 1. Then, the ratio of the film etching speed to the film growth speed is higher in the neighborhood of the $WSi_x$ film 3 than elsewhere opposite the substrate. As a result of that, the silicon oxide film is rapidly deposited opposite the substrate 1 except for in the neighborhood of the Wsix film 3. Finally, a silicon oxide film 5b as shown in FIG. 1b is obtained. Next, a high frequency bias of 80 W is applied to the ECR plasma including a mixture of nitrogen and argon in the same apparatus, and an insulating film 5c is produced by sputtering the silicon oxide film 5b until the WSix film 3 is exposed (FIG. 1(c)).

Next, as shown in FIG. 1(d), a photoresist film 7 is patterned, and a multiple layer low resistance metal 8, such as Ti(200 Angstroms)/Mo(500 Angstroms)/Au(5000 Angstroms) is deposited only on the WSix film 3 by the lift off method. Finally, source and drain electrodes are deposited complete a refractory metal self-aligned gate field effect transistor having a low resistance gate (FIG. 7(i)).

In this embodiment, a refractory metal gate electrode 3, comprising WSix film of 3000 Angstroms thickness, is produced on a substrate 1, and a silicon oxide film 5a is deposited thereon to a thickness of 1000 Angstroms by an ECR-plasma CVD method without applying a substrate bias. Thereafter, a high frequency bias of 80 W is applied to the substrate 1 to deposit a flat silicon oxide film 5b, and a high frequency bias of 80 W is applied to the ECR plasma including a mixture of nitrogen and argon and sputtering of the silicon oxide film 5b is carried out until the WSix film 3 is exposed. Therefore, exposure of the top portion of the WSix film 3 has good uniformity over the wafer surface, and further production and etching of the insulating film can be conducted in a single sputtering apparatus. Thus, the production of the insulating film is simplified, thereby enabling production of a semiconductor device having a low resistance gate by a simple production process at a high yield.

In the above-described first embodiment, however, during the sputter etching using a mixed gas plasma of $N_2$ and argon to expose the refractory metal electrode 3 comprising the refractory metal silicide (FIGS. 1(b) and (c)), the selectivity of the insulating film and the refractory metal silicide is not sufficient and the top portion of the refractory metal silicide may be undesirably removed.

Figure 1:
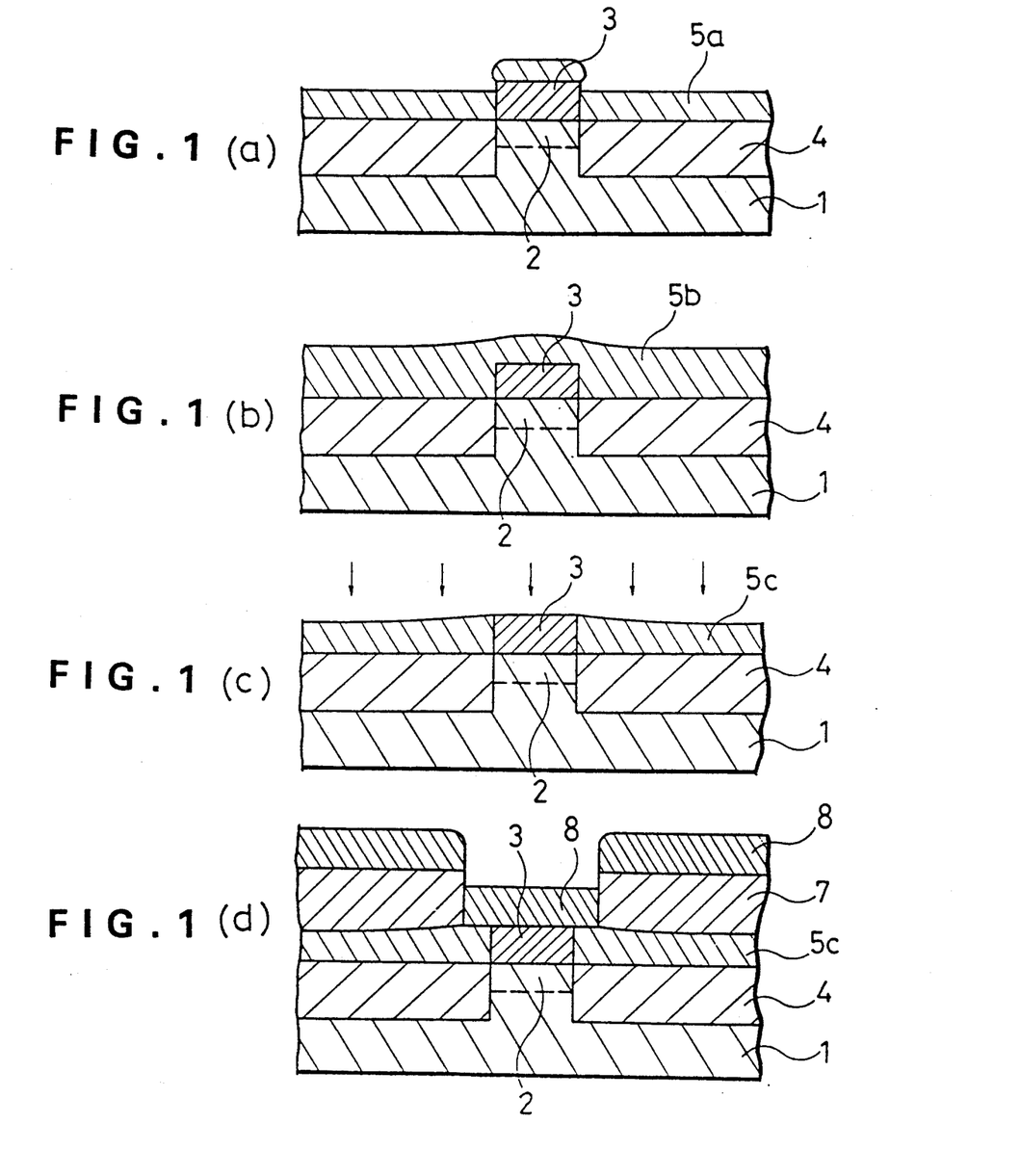
FIGS. 1(a) to 1(d) are cross-sectional views of the major production process steps of a method of producing a semiconductor device according to a first embodiment of the present invention.
Figure 2A:
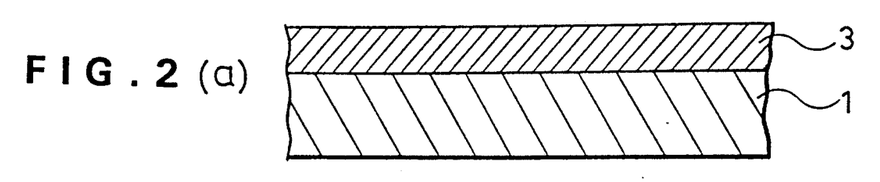
FIGS. 2(a) to 2(d) are cross-sectional structural views for explaining problems in the production method of FIG. 1.
Figure 2B:
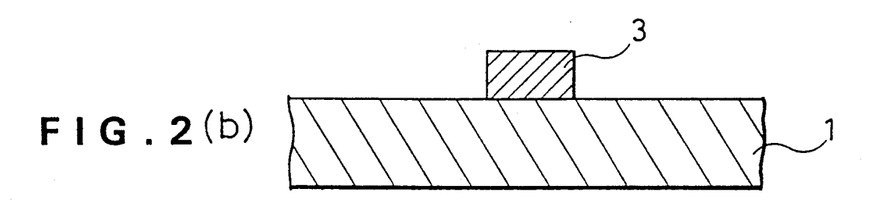
Figure 2C:
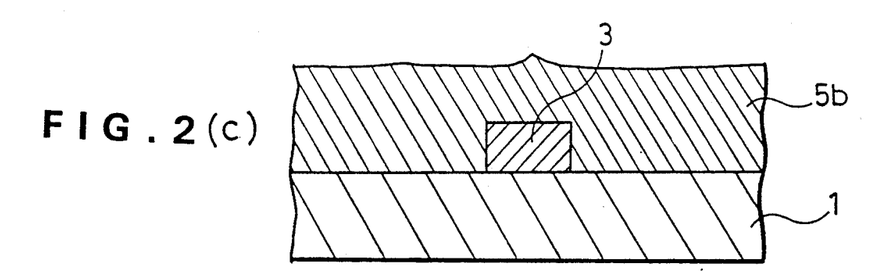
Figure 2D:
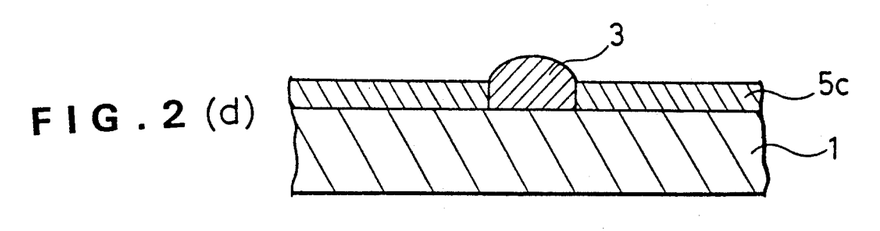

That is, as shown in FIG. 2(d), if the exposure of the refractory metal silicide electrode is carried out by etching back the flattening insulating film 5b by sputter etching a mixed gas plasma of $N_2$ and argon after depositing the refractory metal silicide film 3 onto the substrate 1 by a sputtering method (FIG. 2(a)), patterning of the refractory metal silicide 3 by RIE (FIG. 2(b)) and deposition of the flattening insulating film 5b covering the refractory metal silicide electrode 3 by a biased ECR CVD method or biased sputtering method (FIG. 2(c)), the top portion of the refractory metal silicide will be removed because the sputtering selectivity between the insulating film and the refractory metal silicide is insufficient. Therefore, in order to achieve complete top exposure, the etching has to be significant. This relatively large etching unfavorably reduces the differential etching margin and makes the process unstable. Further, if the etched refractory metal silicide is taken into the insulating film, it causes deterioration in the device properties.

As protection against such problems in the top exposure process, a refractory metal having a lower sputter etching rate than that of the refractory metal silicide may be deposited on the refractory metal silicide layer 3 and sputter etching may then be undertaken.

The principle of this method of exposure of the electrode will be described with reference to FIGS. 3(a) to 3(d).

First of all, a refractory metal silicide film 3 is deposited on the substrate 1 by the sputtering of a refractory metal silicide. Further, a thin refractory metal film 3a is deposited by sputtering a refractory metal (FIG. 3(a)). Thereafter, a pattern is formed by reactive ion etching, thereby producing an electrode (FIG. 3(b)).

Figure 3A:
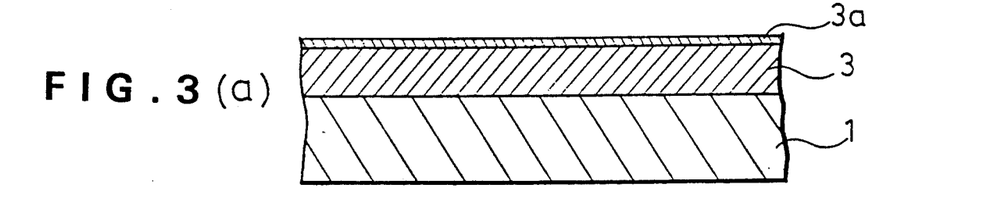
FIGS. 3(a) to 3(d) are a cross-sectional view for explaining the principles for solving the problems in the above-described embodiment production method.
Figure 3B:
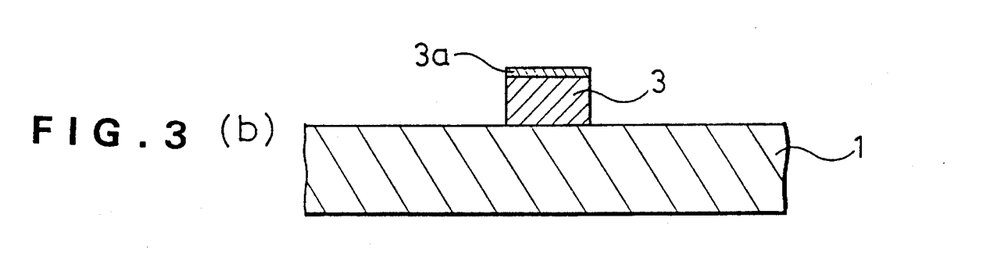
Figure 3C:
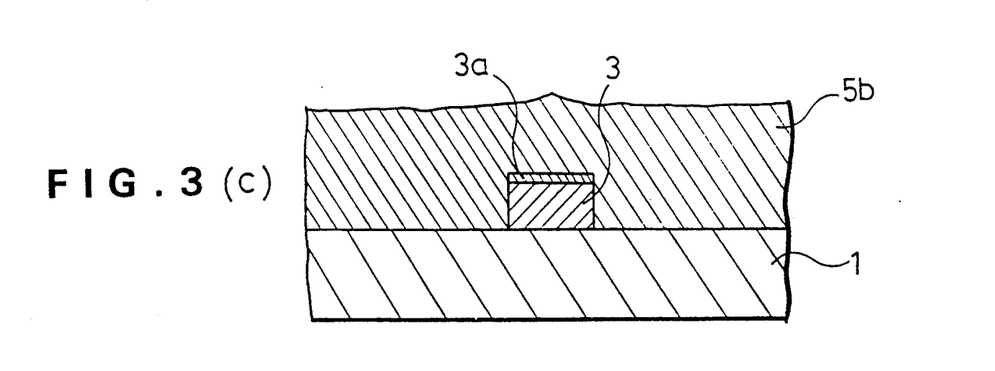
Figure 3D:
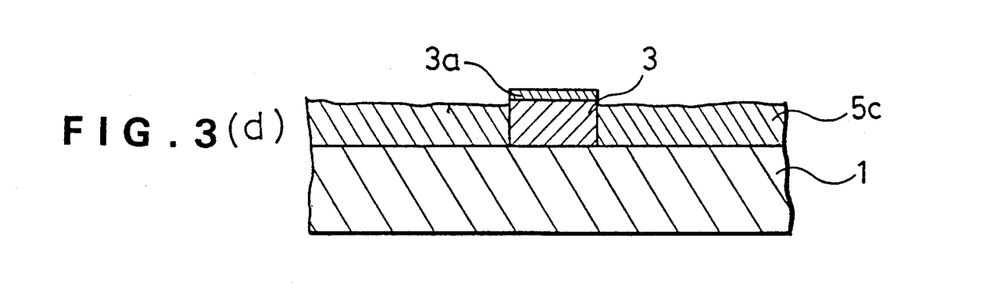

Thereafter, a flattening insulating film 5b is deposited on the entire surface (FIG. 3(c)). Thereafter, the insulating film 5b is sputter etched in a plasma of $N_2$ and argon, and the top portion of the electrode of the double-layer structure comprising the refractory metal silicide film and the refractory metal film is exposed leaving the insulating film 5c (FIG. 3(d)).

In this method, because the refractory metal has a slower sputter etching rate than the refractory metal silicide, the selectivity between the electrode and the insulating film during the etching is enhanced by the refractory metal on the refractory metal silicide. Thereby, the exposure of the electrode can be carried out without risking removal of or damage to the electrode.

Figure 6A:
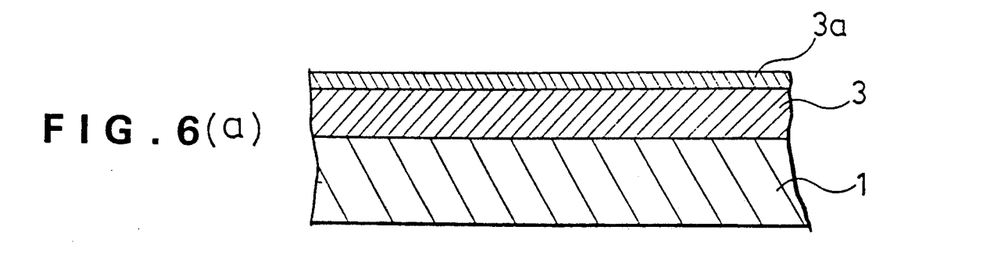
FIGS. 6(a) to 6(d) are cross-sectional views for explaining problems where the refractory metal is too thick in the method shown in FIG. 3.
Figure 6B:
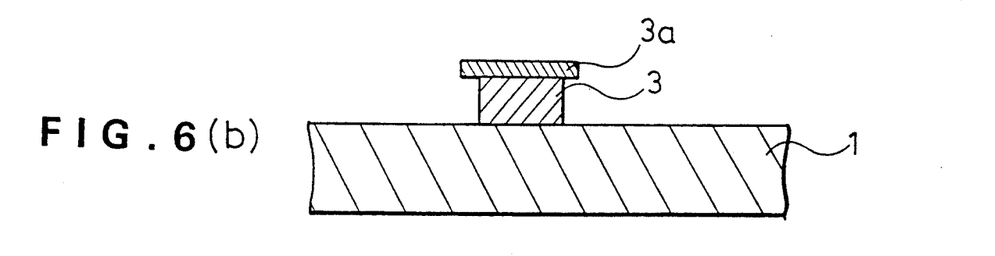
Figure 6C:
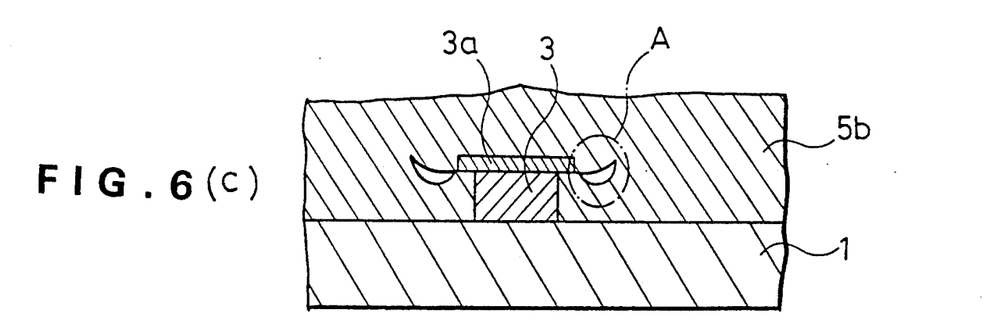
Figure 6D:
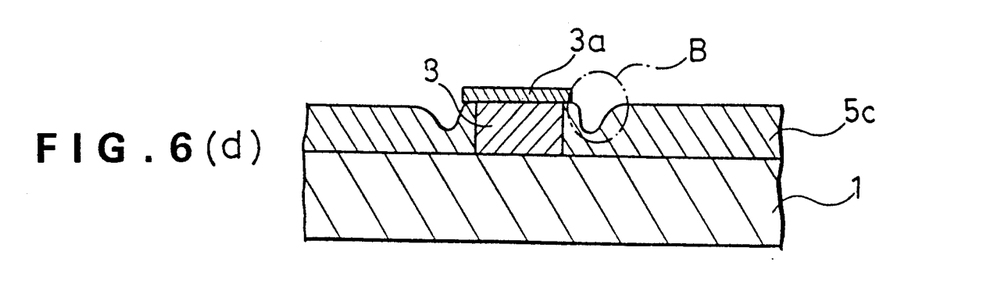

However, because the etching rate of the RIE refractory metal is generally lower than that of the refractory metal silicide, the sides of the refractory metal cannot be etched uniformly with the refractory metal silicide when the refractory metal film is too thick. That is, as shown in FIG. 6a, when the refractory metal film 3a on the refractory metal silicide film 3 is thick, the refractory metal silicide film 3 etched at its side walls much deeper than the refractory metal film 3a. The refractory metal film 3a takes on a hood configuration as shown in FIG. 6(b). When the flattened insulating film 5b is produced by a biased ECR-CVD method or a biased sputtering method, a void A as shown in FIG. 6(c) is produced. When this insulating film is sputter etched, the insulating film at both sides of the electrode is etched abnormally deeply as shown in FIG. 6(d), thereby producing a concave portion B.

Accordingly, the thickness of the refractory metal film has to be made thick enough that the selectivity of the electrode and the insulating film during the sputter etching is adequate and thin enough that the electrode may be etched uniformly along its side walls during RIE etching. In other words, the thickness of the refractory metal film has to be optimized, for example, at about 180 Angstroms when using tungsten.

FIGS. 4(a) to 4(i) show cross-sectional views of the production process steps of a method of producing a semiconductor device according to a second embodiment of the present invention. Herein, the above-described top exposure method is applied to the gate electrode of a field effect transistor (hereinafter referred to as FET), and a gold electrode is deposited on top of the gate electrode, which is exposed from the insulating film.

First of all, silicon ions are implanted into the GaAs substrate 1 with an energy of 50 KeV and in a dose of $4\times 10^{12}/cm^2$ thereby to produce an active layer 2 of several thousands Angstroms, depth. WSi is sputtered to deposited a refractory metal silicide layer (WSi film) 3 of 3000 to 5000 Angstroms thickness and W is sputtered to deposited a refractory metal layer (W layer) 3a of 180 Angstroms thickness successively (FIG. 4(a)).

Next, RIE is carried out for about 10 minutes using $CF_4+O_2$ as an etching gas to produce a gate electrode. Thereafter, silicon in a high concentration is ion implanted to produce source and drain regions using this gate electrode as a mask (FIG. 4(b)). Herein, the implantation energy and dose are respectively 150 KeV and $3\times 10^{13}/cm^2$.

Figure 4:
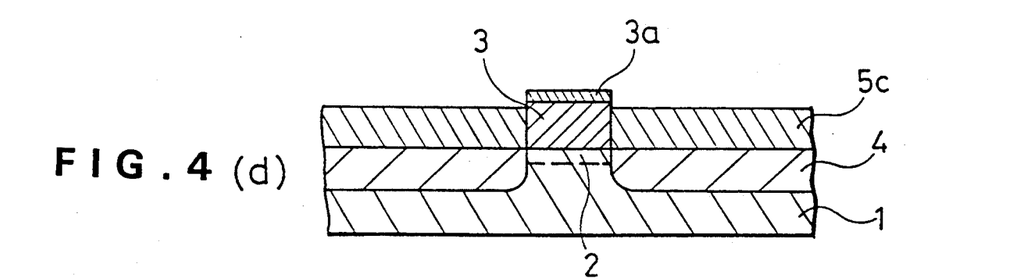
FIGS. 4(a) to 4(i) are cross-sectional views of the major production process steps of a method of producing a semiconductor device according to a second embodiment of the present invention.
Figure 4A:
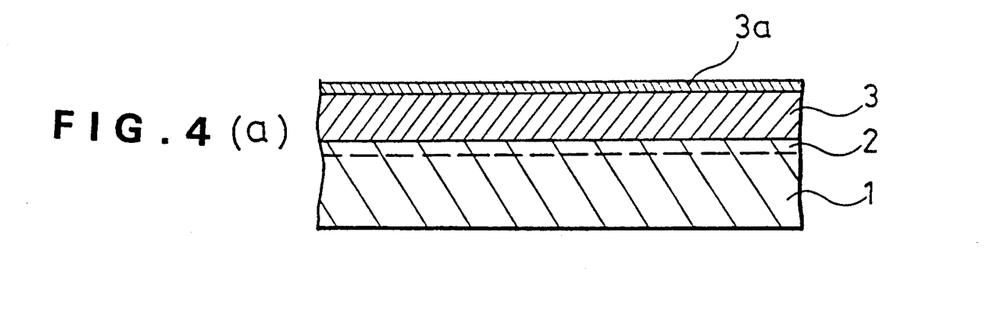
Figure 4B:
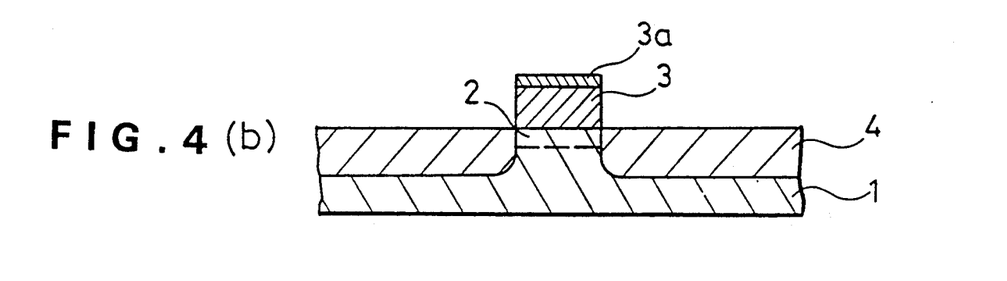
Figure 4C:
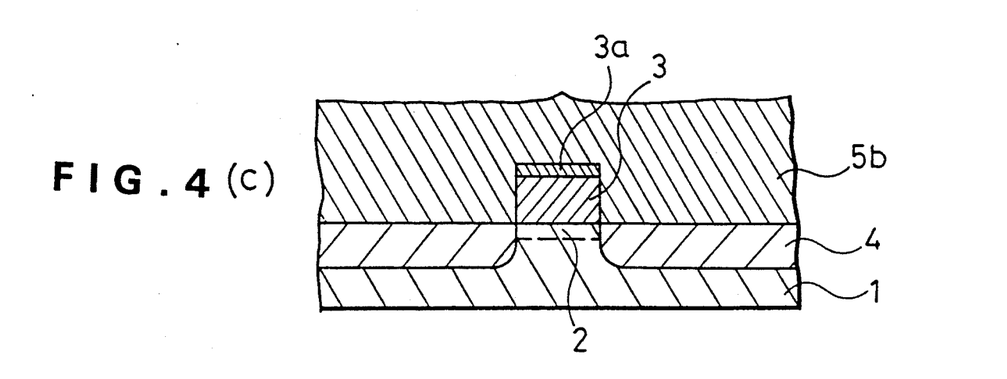

After annealing at about 800° C., a flattening resist (SiO film) 5b is deposited in a thickness of about 5000 to 5500 Angstroms using $SiH_4+O_2+Ar$ as a reactive gas in a biased ECR-CVD Process or a biased sputtering method (FIG. 4(c)).

Thereafter, the flattening insulating film 5b is sputter etched for 10 to 30 minutes in a plasma of $N_2$ and Ar, thereby exposing the top of the gate electrode (FIG. 4(d)). A photoresist film 7a is deposited and formed into a mask overlying the electrode 3 and contiguous parts of the remaining insulating film 5c. Subsequently, the remaining insulating film 5c is etched using the photoresist film 7a as a mask (FIG. 4(e)), and a metal layer 10 is deposited (FIG. 4(f)) over the entire surface. Source and drain electrodes 10 are produced at the both sides of the gate (FIG. 4(g)) by the lite-off method.

Subsequently, after applying a resist mask by photolithography, a gold layer 8 is deposited only on the gate electrode 3 and the adjacent insulating film portions using the lift-off method (FIG. 4(h)). Finally a passivation film (SiN film) 101 is deposited on the entire surface thereby to complete the field effect transistor (FIG. 4(i)).

By the above-described process, a high speed FET is produced because of the low gate resistance. Further, the noise figure $F_0$ of FET is experimentally represented by the following formula.

$$F_0 = 1 + 2\pi k_f f C_{gs} \sqrt{\frac{R_g + R_s}{g_m}}$$

where
$K_f$ is a fitting parameter
f is the operation frequency
$C_{gs}$ is the gate to source capacitance
Rg is the gate resistance
Rs is the source resistance and
gm is the transconductance Herein, by the reduction in the gate resistance Rg, lowering of noise can be achieved.

In the second embodiment of the present invention, the gate electrode structure comprises a refractory metal silicide and a refractory metal deposited thereon. The thickness of the refractory metal is optimized so that it is less than the thickness capable of being etched at the side walls in the RIE process for electrode production and more than the thickness necessary for sufficient selectivity in the sputter step. Therefore, in addition to the effects of the first embodiment, the selectivity of the insulating film and the electrode in sputter etching using a plasma of $N_2$ and Ar is enhanced and the process of exposing an electrode from the insulating film can be conducted stably.

FIGS. 5(a) to 5(e) show a third embodiment of the present invention. This figure shows a process for producing a contact for multiple layer wiring using the above-described electrode exposure method. In FIG. 5, the same reference numerals as those shown in FIG. 4 represent the same portions. Reference numeral 11 designates a lower layer wiring 2000 to 3000 Angstroms in thickness deposited on the substrate 1. Reference numeral 12 designates an upper layer wiring about 5000 Angstroms in thickness connected with the lower layer wiring 11. The contacts of the both layers are established as follows.

Figure 5A:
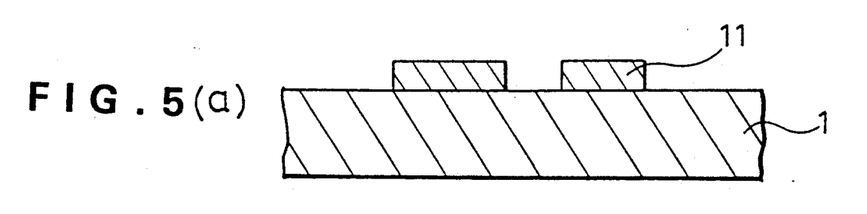
FIGS. 5(a) to 5(e) are cross-sectional views of the major production process steps of a method of producing a semiconductor device according to a third embodiment of the present invention.
Figure 5B:
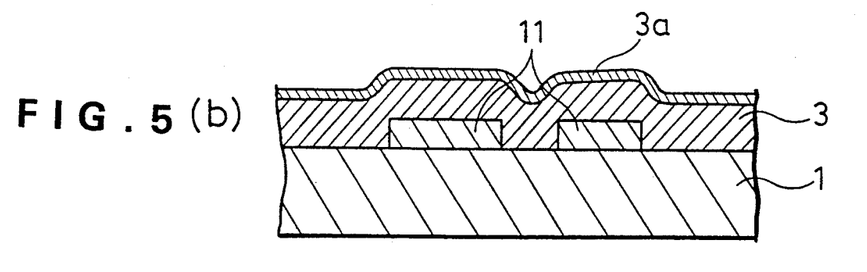
Figure 5C:
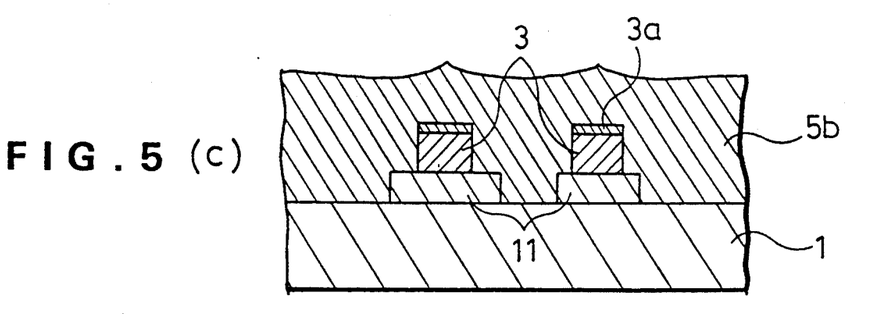
Figure 5D:
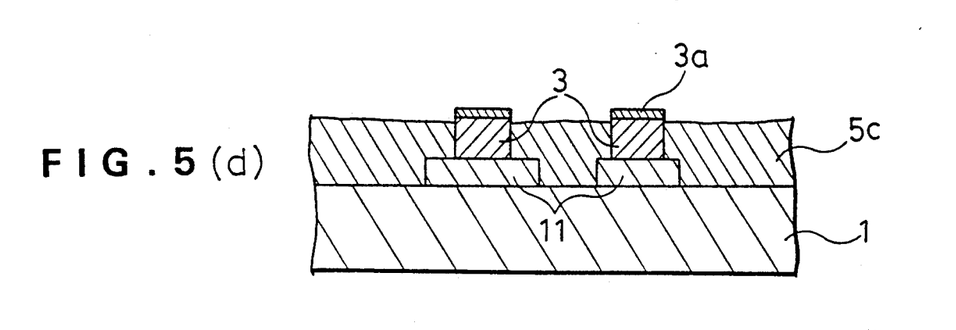

First of all, a lower layer wiring 11 is deposited on a semiconductor substrate 1 (FIG. 5(a)), and thereafter WSi and W are successively sputtered to deposited a refractory metal silicide layer (WSi layer) 3 and a refractory metal layer (W layer) 3a (FIG. 5(b)). Thereafter, similarly as in the first embodiment, a patterning of the WSi/W electrode is carried out by RIE, a flattened insulating film 5b is produced in a biased ECR-CVD method (FIG. 5(c)), exposure of the electrode is carried out by sputter etching (FIG. 5(d)), and thereafter the upper layer wiring 12 is produced (FIG. 5(e)).

Figure 5E:
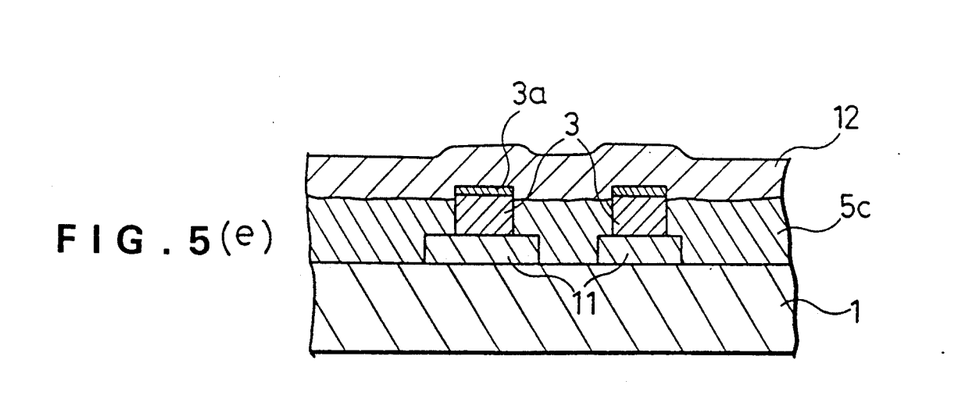

In this embodiment, the surface plane on which the upper layer wiring 12 is deposited can be approximately planar, whereby wire breakage the upper layer wiring can be effectively suppressed.

As is evident from the foregoing description, according to the present invention, a refractory metal gate electrode is selectively produced on a substrate, and thereafter an insulating film is produced on a region of the substrate except for the gate electrode to cover this region in an electron cyclotron resonance plasma chemical vapor deposition method while applying a high frequency substrate bias. Therefore, the surface of refractory metal gate layer can be exposed with good uniformity in the wafer surface, and the deposition of an insulating film can be carried out simply, thereby enabling production with a high yield of a high quality field effect transistor having a low resistant gate.

Furthermore, the refractory metal gate electrode comprises a refractory metal silicide layer and a refractory metal disposed thereon. The thickness of the refractory metal layer is less than the thickness capable of being etched at the side walls in an RIE step for electrode production and is more than the thickness necessary for obtaining sufficient sputter etching selectivity. Therefore, the selectivity of the insulating film and the electrode portion can be enhanced during sputter etching using a plasma of $N_2$ and Ar, and exposure of the electrode can be conducted uniformly.

What is claimed is:

1. A method of producing a semiconductor device including:

depositing a refractory metal gate electrode at a region of a semi-insulating substrate;

forming a first insulating film on said substrate in a thickness less than that of the gate electrode using an electron cyclotron resonance plasma chemical vapor deposition method without applying an electrical bias to the substrate;

depositing a second insulating film on the first insulating film and gate, covering the gate electrode, by the electron cyclotron resonance plasma chemical vapor deposition method, while applying an electrical bias to the substrate; and sputter etching the first and second insulating films using the electron cyclotron resonance plasma process while applying an electrical bias to the substrate to remove the second insulating film and thereby expose said gate electrode.

2. The method of claim 1 including depositing as said first insulating film a silicon oxide film about 1000 Angstroms thick with a flow rate ratio of silane and oxygen of 5:3 and a gas pressure of $1.0 \times 10^{-3}$ Torr, depositing as said second insulating film a silicon oxide film with a flow rate ratio of argon, silane, and oxygen of 6:1:5 and a gas pressure of $7 \times 10^{-4}$ Torr, and sputter etching said first and second insulating films while applying a high frequency bias of to the substrate in an electron cyclotron resonance plasma in a mixture of nitrogen and argon.

3. A method of producing a semiconductor device comprising:

depositing a refractory metal silicide layer and a refractory metal layer successively on a semi-insulating substrate, the refractory metal having a slower sputter etching rate than the refractory metal silicide;

etching the refractory metal silicide and the refractory metal to define a double-layer electrode disposed on the substrate;

depositing an insulating film on the substrate and electrode; and exposing the electrode by sputter etching the insulating film whereby the electrode is exposed by sputter etching of the insulating film without substantial damage to or etching of the refractory metal silicide.

4. The method of claim 3 including depositing said refractory metal layer to such a thickness that the layers of refractory metal silicide and refractory metal can be substantially uniformly etched at their side walls and that sufficient differential sputter etching speeds can be achieved between the refractory metal silicide and the refractory metal to avoid etching of the refractory metal silicide in the sputter etching step.

5. The method of claim 3 including depositing the refractory metal silicide layer to a thickness of 3000 to 5000 Angstroms by sputtering tungsten silicide, depositing the refractory metal layer to a thickness of about 180 Angstroms by sputtering tungsten, depositing the insulating film to a thickness of about 5000 to 5500 Angstroms in a biased substrate electron cyclotron resonance plasma chemical vapor deposition process utilizing silane and oxygen as reactive gases, and sputter etching said insulating film in a plasma of nitrogen and argon.

6. The method of claim 3 wherein said electrode is a first wiring layer and including, after exposure of said electrode, depositing a second wiring layer in electrical contact with the first wiring layer.

* * * * *